(12) United States Patent
Roeckner et al.

(10) Patent No.: US 12,738,901 B2
(45) Date of Patent: Sep. 15, 2026

(54) ACTIVE BALUN AMPLIFIER

(71) Applicant: Huawei Technologies Co., Ltd., Shenzhen (CN)

(72) Inventors: William Roeckner, Carpentersville, IL (US); Terrie McCain, Round Lake, IL (US); Matthew Miller, Arlington Heights, IL (US)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 324 days.

(21) Appl. No.: 18/412,135

(22) Filed: Jan. 12, 2024

(65) Prior Publication Data

US 2024/0154585 A1 May 9, 2024

Related U.S. Application Data

(63) Continuation of application No. PCT/US2021/041623, filed on Jul. 14, 2021.

(51) Int. Cl.
*H03F 3/193* (2006.01)

(52) U.S. Cl.
CPC ......... *H03F 3/193* (2013.01); *H03F 2200/09* (2013.01); *H03F 2200/294* (2013.01); *H03F 2200/451* (2013.01)

(58) Field of Classification Search
CPC . H03F 3/193; H03F 3/265; H03F 3/30; H03F 2200/09; H03F 2200/294; H03F 2200/451
See application file for complete search history.

(56) References Cited

U.S. PATENT DOCUMENTS 6,433,720 B1 * 8/2002 Libove ............. H03K 17/04106 341/145
6,512,416 B2 1/2003 Burns et al.
8,421,541 B2 * 4/2013 Sengupta ............ H03F 3/45188 327/359
8,731,506 B2 * 5/2014 Rossi ...................... H03F 3/193 455/313
2010/0019848 A1 1/2010 Rossi
2017/0359040 A1 * 12/2017 Naeini .................... H03F 3/189

* cited by examiner

*Primary Examiner* — Sibin Chen
(74) *Attorney, Agent, or Firm* — Slater Matsil, LLP

(57) ABSTRACT

An active balun amplifier includes a first plurality of metal oxide semiconductor (MOS) transistors arranged in series, the first plurality of MOS transistors comprising a first input transistor of a first conductivity type, a second input transistor of a second conductivity type, and at least two common-gate transistors arranged in series between the first input transistor and the second input transistor, wherein a gate of the first input transistor and a gate of the second input transistor are tied to a common input, a second plurality of MOS transistors arranged in series, the second plurality of MOS transistors comprising a first common-source transistor of the first conductivity type, a second common-source transistor of the second conductivity type, and at least two cascode transistors arranged in series between the first common-source transistor and the second common-source transistor.

28 Claims, 9 Drawing Sheets

ACTIVE BALUN AMPLIFIER

CROSS-REFERENCE TO RELATED APPLICATIONS

This application is a continuation of International Patent Application No. PCT/US2021/041623, filed on Jul. 14, 2021, and entitled "Active Balun Amplifier," which application is hereby incorporated herein by reference in its entirety.

TECHNICAL FIELD

The present disclosure generally relates to active balun amplifiers, including low noise amplifiers with segmented gain control.

BACKGROUND

Baluns includes devices that are used in radio frequency (RF) communications to convert single-ended signals received at an antenna to differential signals for analog signal processing at a transceiver integrated circuit (IC) to achieve good supply rejection, signal isolation, and linearity. Passive baluns include transformers that can be relatively large, especially for lower frequencies of the RF spectrum.

SUMMARY

Implementations of the subject matter described herein can offer several advantages. For instance, in some implementations, the devices encompassed by the present application can achieve low noise, high gain, and high linearity. In some implementations, the analog signal processing within a transceiver integrated circuit is fully differential so as to achieve good supply rejection, signal isolation, and improvements in linearity. In some implementations, the design of the devices described herein can be achieved using a small die area.

This specification involves active balun amplifiers, low noise amplifier circuits for automatic gain control, and transceivers including low noise amplifier circuits. In one aspect an active balun amplifier includes a first plurality of metal oxide semiconductor (MOS) transistors arranged in series, the first plurality of MOS transistors comprising a first input transistor of a first conductivity type, a second input transistor of a second conductivity type, and at least two common-gate transistors arranged in series between the first input transistor and the second input transistor, wherein a gate of the first input transistor and a gate of the second input transistor are tied to a common input, a second plurality of MOS transistors arranged in series, the second plurality of MOS transistors comprising a first common-source transistor of the first conductivity type, a second common-source transistor of the second conductivity type, and at least two cascode transistors arranged in series between the first common source transistor and the second common source transistor; and a coupling capacitor, wherein a first end of the coupling capacitor is coupled to a first coupling point located between the first input transistor and a first common gate transistor and to a gate of the first common-source transistor, and wherein a second end of the coupling capacitor is coupled to a second coupling point located between the second input transistor and a second common gate transistor and to a gate of the second common source transistor.

Other implementations of this aspect include corresponding low noise amplifier circuits for automatic gain control, and transceivers including low noise amplifier circuits, configured to include the active balun amplifier. These and other embodiments can each optionally include one or more of the following features.

In some implementations, the first input transistor and the first common-source transistor are tied to ground.

In some implementations, second input transistor and the second common-source transistor are tied to a bias voltage supply.

In some implementations, the first common-gate transistor is of the first conductivity type and is directly coupled to the first input transistor, and wherein the second common-gate transistor is of the second conductivity type and is directly coupled to the second input transistor.

In some implementations the active balun amplifier includes a first cascode transistor of the first conductivity type the first cascode transistor is directly coupled to the first common-source transistor, and a second cascode transistor of the second conductivity type, the second cascode transistor directly coupled to the second common-source transistor.

In some implementations, a gate of the first cascode transistor is coupled to an alternating current (AC) ground, and a gate of the second cascode transistor is coupled to the AC ground.

In some implementations the active balun amplifier includes: a first capacitor between the first end of the coupling capacitor and the gate of the first common-source transistor; and a second capacitor between the second end of the coupling capacitor and the gate of the second common-source transistor.

In some implementations the active balun amplifier includes a third capacitor between the gate of the first input transistor and the common input; and a fourth capacitor between the gate of the second input transistor and the common input.

In some implementations the active balun amplifier includes: an operational amplifier, wherein a first input of the operational amplifier is coupled to a reference voltage; a first sense resistor, wherein a first end of the first sense resistor is coupled to a second input of the operational amplifier, and wherein a second end of the first sense resistor is coupled to an output of the first plurality of MOS transistors; a second sense resistor, wherein a first end of the second sense resistor is coupled to the second input of the operational amplifier, and wherein a second end of the second sense resistor is coupled to an output of the second plurality of MOS transistors, and a first bias resistor; and a second bias resistor, wherein an output of the operation amplifier is coupled to the gate of the second input transistor through the first bias resistor and to the gate of the second common-source transistor through the second bias resistor.

In some implementations the output of the first plurality of MOS transistors is located between a first common-gate transistor and a second common gate transistor, and the output of the second plurality of MOS transistors is located between a first cascode transistor and a second cascode transistor.

In some implementations the first plurality of MOS transistors includes four common gate transistors arranged in series between the first input transistor and the second input transistor, the second plurality of MOS transistors includes four cascode transistors between the first common-source transistor and the second common-source transistor.

In some implementations the first plurality of transistors includes a first overvoltage protection transistor coupled to the first input transistor, an a second overvoltage protection transistor coupled to the second input transistor, wherein the second plurality of transistors includes a third overvoltage protection transistor coupled to the first common-source transistor, and a fourth overvoltage protection transistor coupled to the second common-source transistor, and wherein a gate of the first overvoltage protection transistor is tied to a gate of the third overvoltage protection transistor, and a gate of the second overvoltage protection transistor is tied to a gate of the fourth overvoltage protection transistor.

Other implementations of this aspect include corresponding systems, apparatus, and computer programs, configured to perform the actions of the methods, encoded on computer storage devices. These and other embodiments can each optionally include one or more of the following features.

The details of one or more embodiments of the subject matter of this specification are set forth in the accompanying drawings and the description below. Other features and advantages of the subject matter will become apparent from the description, the drawings, and the claims.

DETAILED DESCRIPTION OF ILLUSTRATIVE EMBODIMENTS

Figure 1:
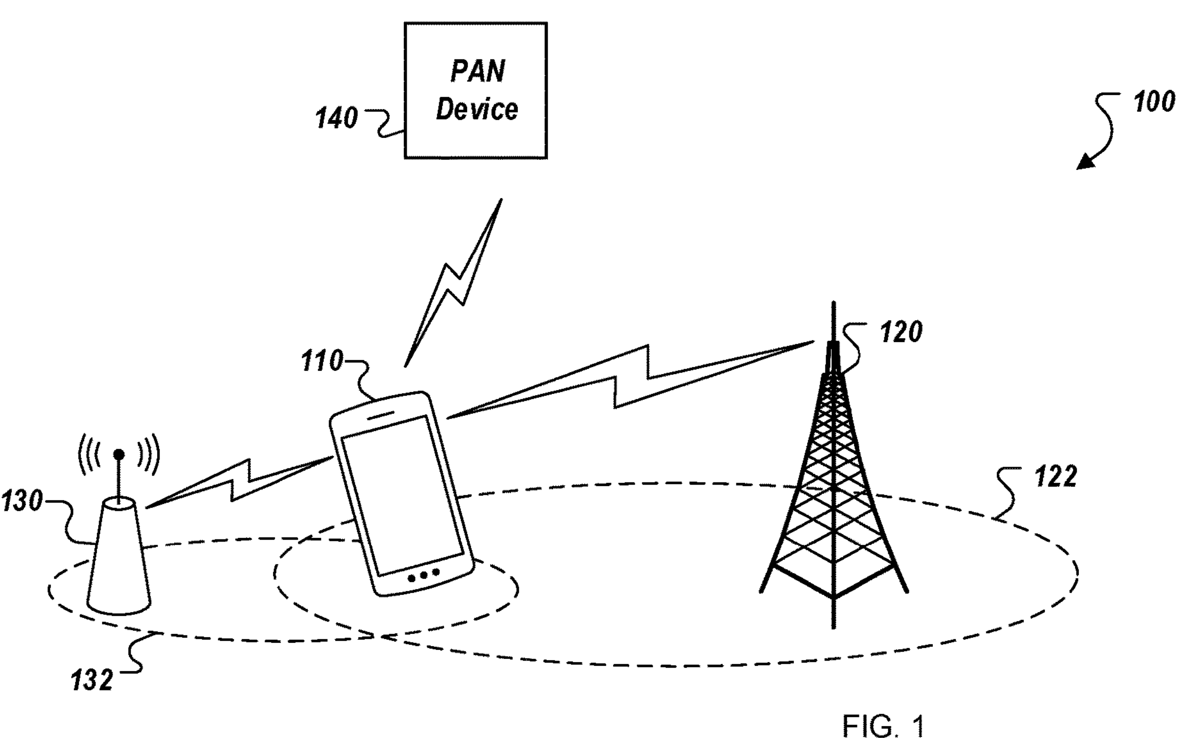
FIG. 1 is a diagram of an example of a wireless communication system.

FIG. 1 is a block diagram of an example wireless communication system 100 including a wireless device no capable of communicating with one or more wireless communication networks. The one or more wireless communication networks with which the wireless device no is capable of communicating can include but is not limited to one or more cellular or wireless wide area networks (WWANs), one or more wireless local area networks (WLANs), one or more wireless personal area networks (WPANs), or a combination thereof.

In the example of FIG. 1, the wireless device no is communicating with at least one WWAN by way of at least one base station 120, at least one WLAN by way of at least one access point 130, and at least one personal area network (PAN) by at least one PAN device 140. The at least one base station 120 can support bi-directional communication with wireless devices that are within the base station's corresponding area of coverage 122. Similarly, the at least one access point 130 can support bi-directional communication with wireless devices that are within access point's corresponding area of coverage 132. Any of the communication devices of FIG. 1 may include the various embodiments of the present disclosure.

In some implementations, the at least one WWAN with which the at least one base station 120 is associated can be a fifth generation (5G) network among other generations and types of networks. In these implementations, the at least one base station 120 can be a 5G base station that employs orthogonal frequency-division multiplexing (OFDM) and/or non-OFDM and a transmission time interval (TTI) shorter than 1 ms (e.g. 100 or 200 microseconds), to communicate with wireless devices, such as wireless device 110. For example, the at least one base station 120 can take the form of one of several devices, such as a base transceiver station (BTS), a Node-B (NodeB), an evolved NodeB (eNB), a next (fifth) generation (5G) NodeB (gNB), a Home NodeB, a Home eNodeB, a site controller, an access point, or a wireless router, or a server, router, switch, or other processing entity with a wired or wireless network. In addition, and as shown in FIG. 1, wireless device no is configured to communicate with one or more personal area network (PAN) devices/systems 140 (e.g., Bluetooth® or radio frequency identification (RFID) systems and devices) over one or more WPANs.

System 100 can use multiple channel access functionality, including for example schemes in which the at least one base station 120 and the wireless device no are configured to implement the Long Term Evolution wireless communication standard (LTE), LTE Advanced (LTE-A), and/or LTE Multimedia Broadcast Multicast Service (MBMS). In other implementations, the at least one base station 120 and wireless device no are configured to implement UMTS, HSPA, or HSPA+ standards and protocols. Of course, other multiple access schemes and wireless protocols can be utilized. In some examples, one or more such access schemes and wireless protocols can correspond to standards that impose RF power amplifier linearity requirements.

To communicate with one or both of the at least one base station 120 and the access point 130, the wireless device no can include singular or multiple transmitter and receiver components similar or equivalent to one or more of those described in further detail below with reference to FIG. 2 to support multiple communications with different types of access points, base stations, and other wireless communication devices.

Although FIG. 1 illustrates one example of a communication system, various changes can be made to FIG. 1. For example, the communication system 100 could include any number of wireless devices, base stations, access points, networks, or other components in any suitable configuration.

Examples of transceiver components and RF components that can be employed in wireless device no and other similar devices are described in further detail below with reference to FIGS. 2-9.

Figure 2:
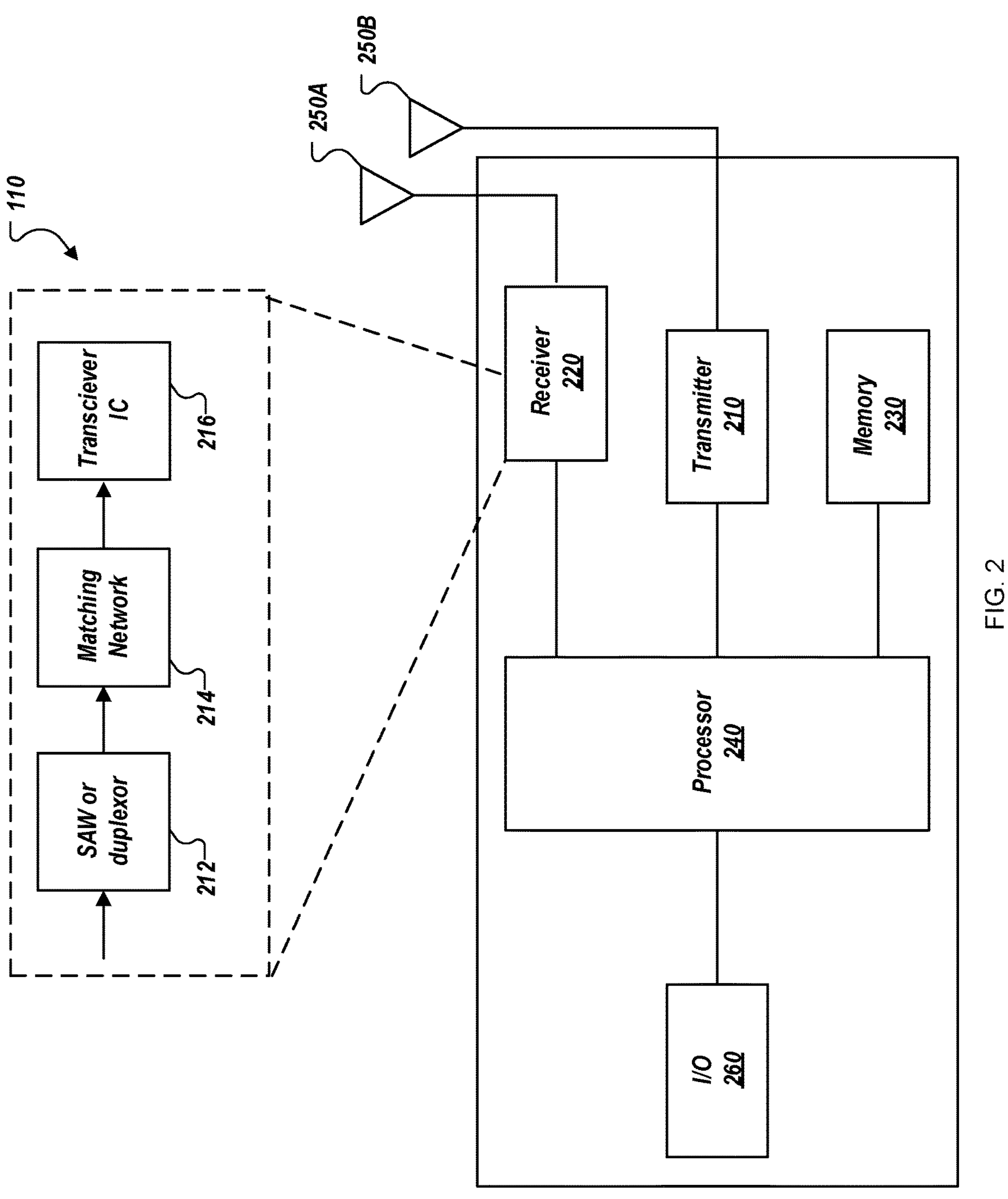
FIG. 2 is a diagram of example details of a wireless device that may implement the methods and teachings according to this disclosure.

FIG. 2 is a block diagram that illustrates example details of the wireless device no that can implement the methods and teachings according to this disclosure. The wireless device no can, for example, be a mobile telephone, but can be other devices in further examples such as a desktop computer, laptop computer, tablet, hand-held computing device, automobile computing device and/or other computing devices. As shown in the figure, the wireless device 110 is shown as including at least one transmitter 210, at least one receiver 220, memory 230, at least one processor 240, and at least one input/output device 260. Here, only one transmitter and only one receiver are shown, but in many embodiments, multiple transmitters and receivers are included to support multiple communications of different types at the same time. Each receiver may employ the innovations of the present disclosure.

The processor 240 can implement various processing operations of the wireless device no. For example, the processor 240 can perform signal coding, data processing, power control, input/output processing, or any other functionality enabling the wireless device no to operate in the system 100 (FIG. 1). The processor 240 can include any suitable processing or computing device configured to perform one or more operations. For example, the processor 240 can include a microprocessor, microcontroller, digital signal processor, field programmable gate array, or application specific integrated circuit, or a combination of these devices.

The transmitter 210 is configured to modulate data or other content, filter and amplify outgoing radio frequency (RF) signals for transmission by at least one antenna 250B. The transmitter 210 can also be configured to amplify, filter and up-convert baseband or intermediate frequency signals to radio frequency (RF) signals before such signals are provided to the antenna 250B for transmission. The transmitter 210 can include any suitable structure for generating RF signals for wireless transmission.

The receiver 220 can be configured to demodulate data or other content received in ingoing RF signals by at least one antenna 250A. The receiver 220 can also be configured to amplify, filter and frequency down convert RF signals received via the antenna 250A either to intermediate frequency (IF) or baseband frequency signals prior to conversion to digital form and processing. The receiver 220 can include any suitable structure for processing signals received wirelessly. In an example, the receiver comprises a surface acoustic wave filter or duplexer 212, a matching network 214, and transceiver IC 216, which are described in more detail with reference to FIG. 3.

Each of the antennas 250A and 250B can include any suitable structure for transmitting and/or receiving wireless RF signals. In some implementations, the antennas 250A and 250B can be implemented by way of a single antenna that can be used for both transmitting and receiving RF signals.

It is appreciated that one or multiple transmitters 210 could be used in the wireless device 110, one or multiple receivers 220 could be used in the wireless device 110, and one or multiple antennas 250 could be used in the wireless device no. For example, in one embodiment, device no includes at least three transmitters 210 and receivers 220 for communicating via a personal area network such as Bluetooth®, a WiFi networks such as IEEE 802.11 based networks, and a cellular network. Each one of these protocol transceivers (transmitter 210 and receiver 220) may employ the concepts of the present disclosure. Although shown as separate blocks or components, at least one transmitter 210 and at least one receiver 220 could be combined into a transceiver. Accordingly, rather than showing a separate block for the transmitter 210 and a separate block for the receiver 220 in FIG. 2, a single block for a transceiver could have been shown.

The wireless device no further includes one or more input/output devices 260. The input/output devices 260 facilitate interaction with a user. Each input/output device 260 includes any suitable structure for providing information to or receiving information from a user, such as a speaker, microphone, keypad, keyboard, display, or touch screen.

In addition, the wireless device no includes at least one memory 230. The memory 230 stores instructions and data used, generated, or collected by the wireless device no. For example, the memory 230 could store software or firmware instructions executed by the processor(s) 240 and data used to reduce or eliminate interference in incoming signals. Each memory 230 includes any suitable volatile and/or non-volatile storage and retrieval device(s). Any suitable type of memory may be used, such as random access memory (RAM), read only memory (ROM), hard disk, optical disc, subscriber identity module (SIM) card, memory stick, secure digital (SD) memory card, and the like.

Figure 3A:
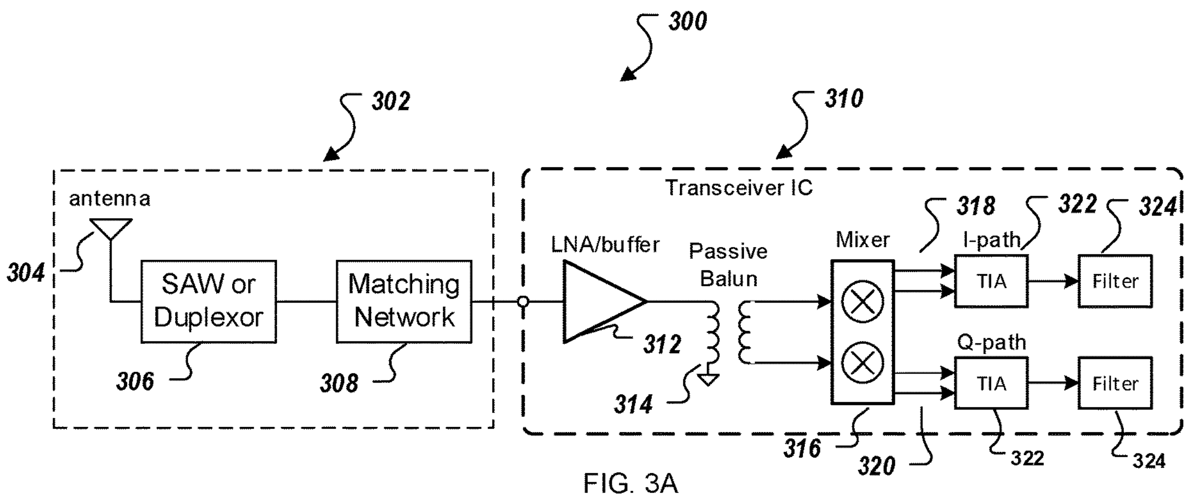
FIGS. 3A-3B are schematics that illustrate examples of transceiver integrated circuits with passive and active baluns.

FIG. 3A is a schematic that illustrates an example of a receiver path 300 using a transceiver integrated circuit (IC) 310 with a passive balun. Antenna 304 can be used for transmitting and/or receiving radio signals. A duplexer or surface acoustic wave filter (SAW) 306 can be used to separate the transmitting and receiving frequencies, for example a frequency duplexer. A matching network 308 can be used to match the source impedance of the antenna 304 to the transceiver IC 310. The transceiver IC can include a low noise amplifier 312. Low noise amplifier 312 may act as a buffer amplifier, buffering the signal from load currents. The RF signal from antenna 304 is single-ended. In an implementation, the analog signal processing within the Transceiver IC is fully differential to achieve good supply rejection, signal isolation, and linearity. To convert the single-ended signal to a differential signal, a balun 314 can be used. To avoid the costs associated with an external balun the single-ended to differential function can be moved to within the transceiver IC. In various implementations, passive balun 314 is implemented as an integrated transformer and can be relatively large, especially for lower RF frequencies.

The output of passive balun 314 is input to a mixer circuit 316, mixer circuit 316 can comprise two local oscillators arranged to decompose the signal into in-phase 318 and quadrature component 320. Each of the in-phase component 318 and quadrature component 320 is passed to a transimpedance amplifier 322, to convert the signal current to voltage and then a filter 324 to remove noise and interfering signals.

Figure 3B:
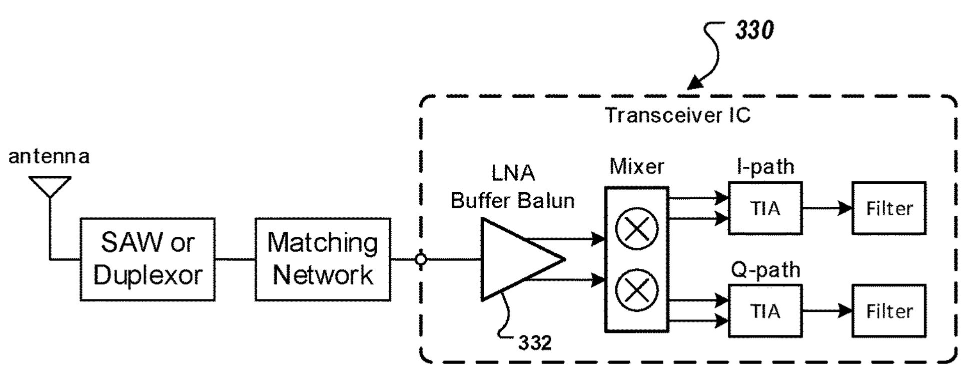

FIG. 3B is a schematic that illustrates an example of a transceiver integrated circuit 330 with an active balun. Transceiver integrated circuit 330 has the same components as transceiver integrated circuit 310 described with reference to FIG. 3A. However, the passive balun 314 is replaced with an active balun 332, which uses transistors to carry out the transformation. An active balun 332 can save large amounts of die area relative to a passive balun. Various implementations of active baluns are described herein with reference to FIGS. 4 and 5.

Figure 4:
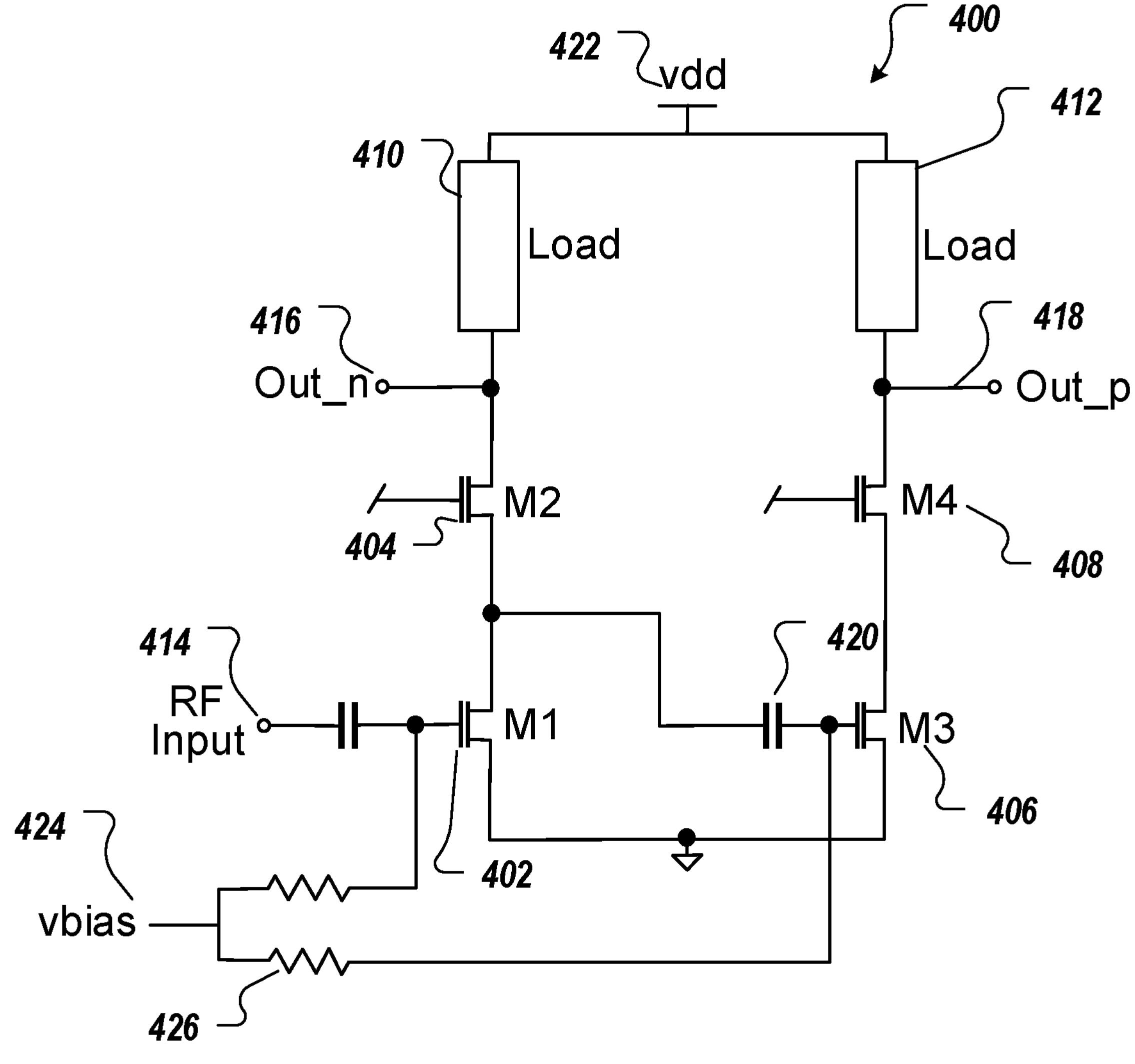
FIG. 4 is a schematic that illustrates an example of an active balun common gate/common source structure.

FIG. 4 is a schematic that illustrates an example of an active balun common gate/common source circuit 400. Active balun circuit **40*o* includes transistors 402, 404, 406, and 408. Active balun circuit 400 further includes load elements (e.g., resistors) 410 and 412, an RF input 414, output_n 416, and output_p 418. Transistor 404 acts as a common gate transistor and transistor 406 acts as a common source transistor. A capacitor 42*o* is coupled between a gate of the transistor 406 and between the source and drain contacts of transistors 402, 404. The capacitor provides DC isolation between the drain of transistor 402 and the gate of transistor 406. The resistor 410 is coupled between a voltage supply end Vdd 422 and the output_n 416, and the resistor 412 is coupled between the voltage supply end Vdd and the output_p 418. The outputs output_n 416 and output_p 418 are coupled to transistors 404 and 408 respectively. In some implementations, large signal performance of this circuit may be limited by the Vgs (gate to source) voltage swing constraints of common gate transistor 404, resulting in a lower 1 dB compression point and reduced linearity. Each of transistors 402, 404, 406, and 408 is a MOSFET transistor of the same conductivity type. In an implementation, each transistor 402-408 is an NMOS transistor. The gates of transistors 402 and 406 can be biased to an appropriate DC bias voltage 424. In an implementation, a current mirror can be used to create the DC bias voltage 424 that biases the gates of the transistors 402 and 406. Bias resistors can be provided to enable RF isolation. For example, a first bias resistor 426***a* can be provided between the bias voltage source 424 and the gate of transistor 402, while a second bias resistor 406 can be provided between the bias voltage source 424 and the gate transistor 406.

The circuit 400 shown in FIG. 4 uses resistor loads in order to provide a voltage output signal, such that the DC bias at the outputs is strictly determined by the IR drop across the load resistors, resulting in limitations for bias current, load resistance, and overall output impedance. Furthermore, the configuration of circuit 400, with the passive load elements, is unable to provide a high amplifier output impedance and current output for use with an integrated receiver amplifier.

Figure 5:
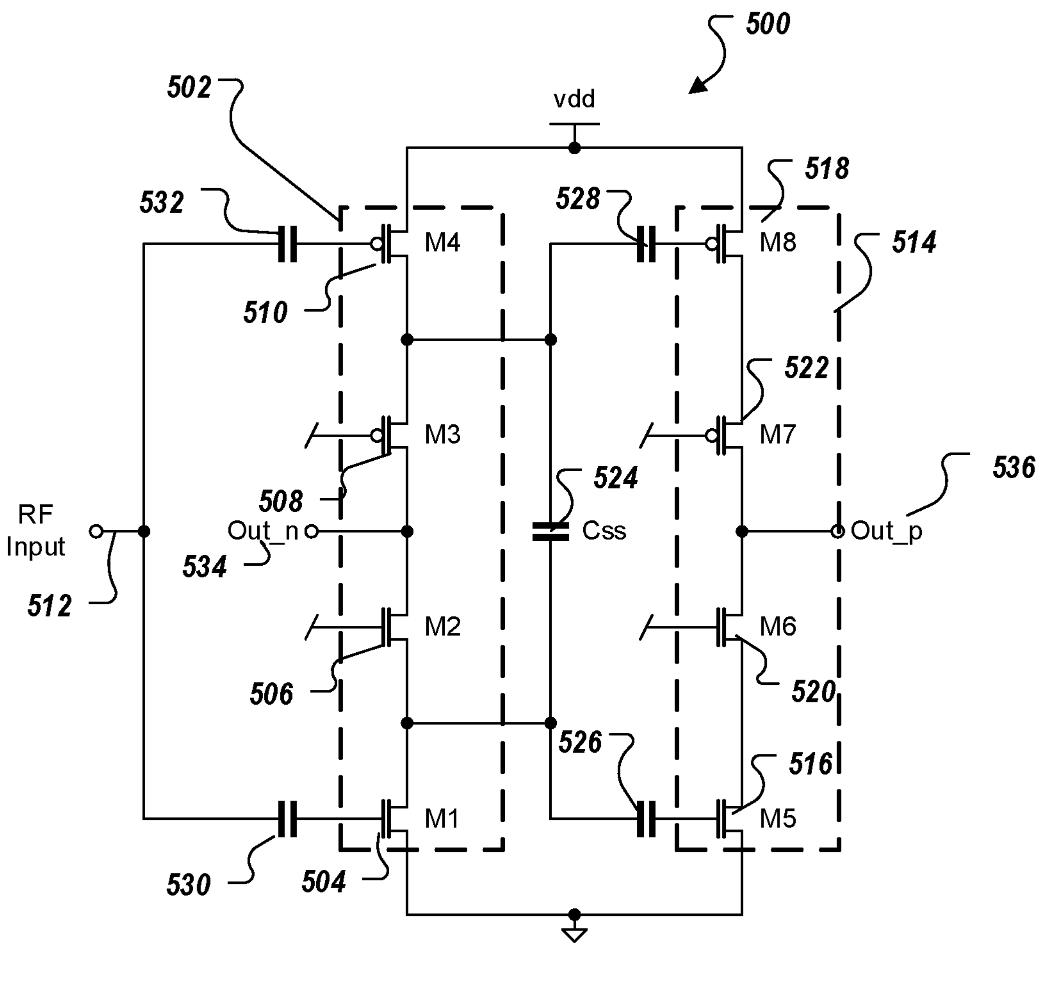
FIG. 5 is a schematic that illustrates an example of an active balun amplifier.

FIG. 5 is a schematic that illustrates an example of a fully complementary common gate/common source (CG/CS) active balun amplifier circuit 500. The active balun amplifier circuit 500 can provide an output current signal with high output impedance. The active balun amplifier circuit 500 further exhibits improved large signal performance with higher 1 dB compression point, improved linearity, and improved phase balance, relative to the balun amplifier described with reference to FIG. 4. Furthermore, the active balun amplifier circuit 500 uses less die area relative to a passive balun.

Active balun amplifier 500 includes a first transistor group 502 having a first plurality of metal oxide semiconductor (MOS) transistors arranged in series coupled between a supply and ground (or circuit common) as shown in FIG. 5. The first plurality of metal oxide semiconductor (MOS) transistors in the first transistor group 502 includes transistors 504, 506, 508, and 510. Each transistor 504, 506, 508, and 510 is a MOS transistor. Transistor 504 is a first input transistor of a first conductivity type, transistor 510 is a second input transistor of a second conductivity type. Input transistors 504 and 510 provide high input impedance and influence the overall gain. At least two common-gate transistors (e.g. common gate transistors 506 and 508) are arranged in series between the first input transistor 504 and the second input transistor 510, wherein a gate of the first input transistor 504 and a gate of the second input transistor 510 are tied to a common RF input 512.

In some implementations, common gate transistor 506 can be of the first conductivity type and can be directly coupled to the first input transistor 504 and second common gate transistor 508 may be of a second conductivity type and can be directly coupled to the second input transistor 510. For example, a transistor of the first conductivity type may include an NMOS transistor and a transistor of the second conductivity type may include a PMOS transistor. In an implementation, the first input transistor 504 and the first common gate transistor 506 can be coupled to ground. The second input transistor 510 and the second common gate transistor 508 can be coupled to a bias voltage supply (Vdd).

Active balun amplifier 500 further has a second transistor group 514 having a second plurality of MOS transistors arranged in series. The second plurality of MOS transistors includes a first common-source transistor 516 of the first conductivity type, a second common-source transistor 518 of the second conductivity type, and at least two cascode transistors 520, 522 arranged in series between the first common source transistor 516 and the second common source transistor 518. Cascode transistors 520, 522 boost the output impedance of the common-source structure.

In an implementation, first cascode transistor 520 is of the first conductivity type and can be directly coupled to the first common-source transistor 516, and second cascode transistor 522 is of the second conductivity type and can be directly coupled to the second common-source transistor 518. In an implementation, a gate of a first cascode transistor 520 is coupled to an alternating current (AC) ground, and a gate of the second cascode transistor 522 is coupled to the AC ground.

Active balun amplifier 500 further includes a coupling capacitor 524, wherein a first end of the coupling capacitor 524 is coupled to a first coupling point located between the first input transistor 504 and a first common gate transistor 506 and to a gate of the first common-source transistor 516 through capacitor 526. A second end of the coupling capacitor 524 is coupled to a second coupling point located between the second input transistor 510 and a second common gate transistor 508 and to a gate of the second common source transistor 518 through capacitor 528.

In an implementation, the coupling capacitor 524 provides a low impedance AC signal path between the source nodes of common gate transistors 506 and 508. In various implementations, this can improve large signal performance. A large RF signal positive voltage at the sources of transistor 506 and transistor 508 can reduce the gate to source voltage (Vgs) of transistor 506 to the point of cut-off, making transistor 506 more nonlinear. At the same time, the source to gate voltage (Vsg) of 508 is increasing, maintaining (or improving) the linearity of 508. Similarly, a large RF signal negative voltage at the sources of transistor 506 and transistor 508 can push 508 toward cut-off while increasing the Vgs of 506. By coupling these two nodes together with coupling capacitor 524, the overall linearity of the amplifier is improved.

In some implementations, active balun amplifier 500 includes a first capacitor 526 between the first end of the coupling capacitor 524 and the gate of the first common-source transistor 516 and a second capacitor 528 between the second end of the coupling capacitor 524 and the gate of the second common-source transistor 518. In some implementations, active balun amplifier 500 includes a third capacitor 530 between the gate of the first input transistor 504 and the common RF input 512 and a fourth capacitor 532 between the gate of the second input transistor 510 and the common RF input 512. Capacitors 526, 528, 530, and 532 provide DC isolation.

In some implementations, the output 534 of the first transistor group 502 is located between a first common-gate transistor and a second common gate transistor. For example, the first output 534 is located between common-gate transistor 506 and transistor 508. In some implementations, the output 536 of the second transistor group 514 is located between a first cascode transistor and a second cascode transistor. For example, the second output 536 is located between cascode transistor 520 and transistor 522.

The overall transconductance of the amplifier 500 can be expressed as:

$$G_m = \frac{g_{m1}}{g_{m2}} g_{m5} + \frac{g_{m4}}{g_{m3}} g_{m8} + g_{m1} + g_{m4} \quad (1)$$

where $g_{m1}$, $g_{m2}$, $g_{m3}$, $g_{m4}$, $g_{m5}$, $g_{m6}$, $g_{m7}$, and $g_{m8}$ are the transconductances of transistors 504, 506, 508, 510, 516, 520, 522, and 518, respectively. Balanced gain between output 534 and 536 can be achieved by setting $g_{m2}=g_{m5}$ and $g_{m3}=g_{m8}$, which simplifies to $$G_m = 2(g_{m1} + g_{m4}). \quad (2)$$

The circuit described with reference to FIG. 5 compensates for the compression/reduction in linearity of the circuit described with reference to FIG. 4. For example, as the RF input signal goes high positive, the gate of transistor 504 goes high, but the drain goes low. However, the source of transistor 508 starts to go low, pushing Vgs of 508 toward cutoff (and thus less linear). The inverse happens when RF input signal goes high negative and transistor 506 goes less linear. The fully complementary design (using mirrored NMOS and PMOS arrangement) means that capacitor 524 can be introduced to act as a short circuit for high frequency RF signals, and allows the signal extremes to be averaged and reduce the effects of nonlinearity in the circuit.

The fully complementary nature of the amplifier 500 means that due to current re-use, the gain of the amplifier is increased for a given current. In various implementations, proper ratios of the PMOS transistors relative to the NMOS transistors can improve linearity. The basic LNA structure shown in FIG. 5 also exhibits an increase in output impedance due to the fully cascoded structure.

Figure 6:
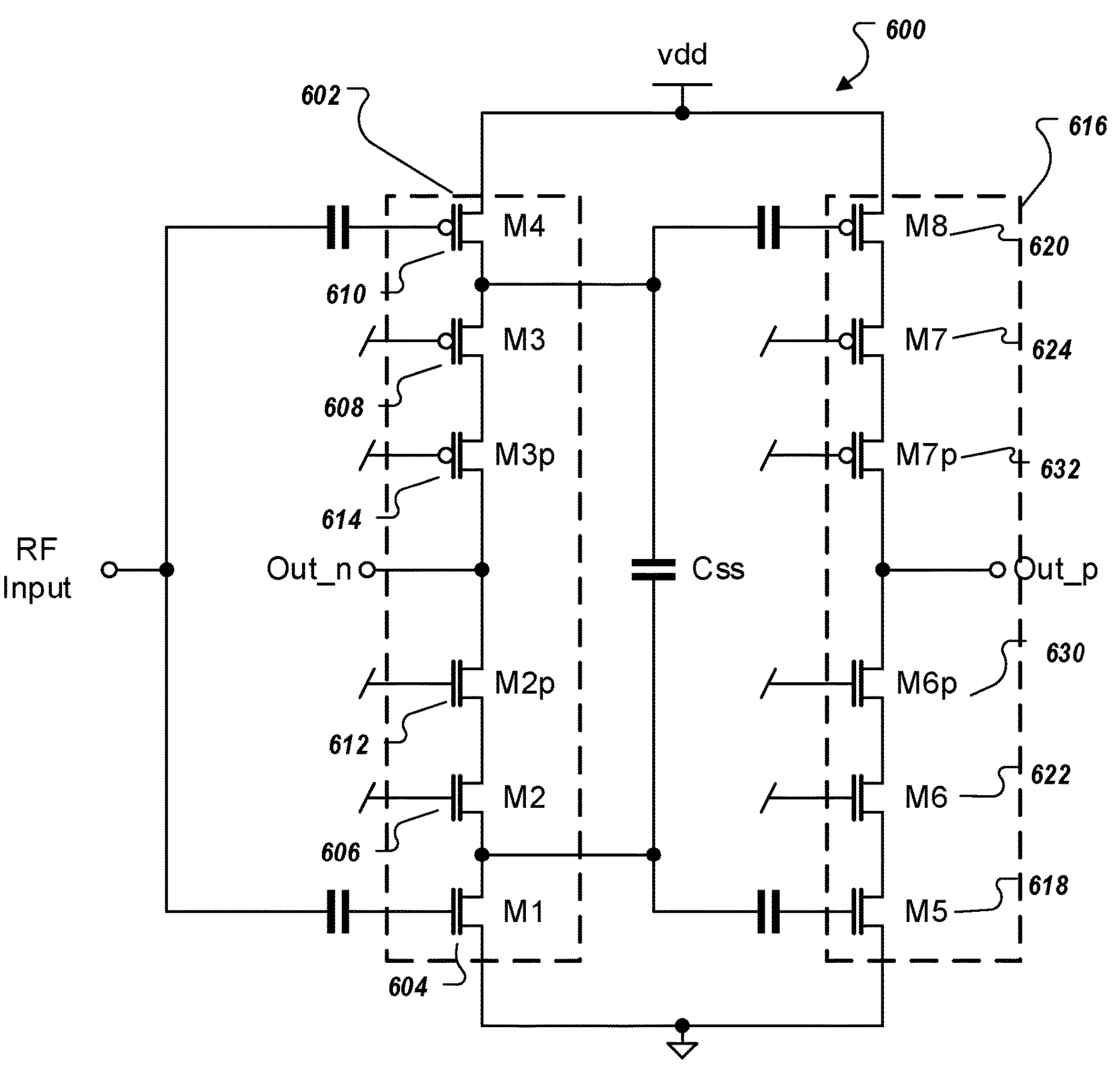
FIG. 6 is a schematic that illustrates an example of an active balun amplifier with over-voltage protection.

FIG. 6 is a schematic that illustrates an example of an alternative implementation of fully complementary common gate/common source (CG/CS) active balun amplifier 600 with over-voltage protection. Active balun amplifier 600 has a first transistor group 602 including a plurality of metal oxide semiconductor (MOS) transistors arranged in series. In particular, first transistor group 602 includes transistors 604, 606, 608, and 610, which are equivalent to the four transistors of group 502 described above with reference to FIG. 5. The first transistor group 602 of amplifier 600 further includes common gate transistor 612 and transistor 614. That is, the first plurality of MOS transistors comprises four common gate transistors arranged in series between the first input transistor 604 and the second input transistor 610. In an implementation, transistor 612 can be of the first conductivity type and transistor 614 can be of the second conductivity type. For example, transistor 612 can be an NMOS transistor and transistor 614 can be a PMOS transistor.

Active balun amplifier 600 further has a second transistor group 616 that includes a second plurality of MOS transistors arranged in series. The second transistor group 616 includes a first common-source transistor 618 of the first conductivity type, a second common-source transistor 620 of the second conductivity type, and at least two cascode transistors 622, 624 arranged in series between the first common source transistor 618 and the second common source transistor 620, which are equivalent to the four transistors of group 514 described above with reference to FIG. 5. The second transistor group 616 of amplifier 600 includes cascode transistors 630 and 632. In particular, the second transistor group 616 includes four cascode transistors arranged in series between the first common-source transistor and the second common-source transistor. In an implementation, transistor 630 can be of the first conductivity type and transistor 632 can be of the second conductivity type. For example, transistor 630 can be an NMOS transistor and transistor 632 can be a PMOS transistor. In this embodiment transistors 612, 614, 630, and 632 are added to provide overvoltage protection during both startup and Automated Gain Control (AGC) transients (Automated Gain Control is described with reference to FIG. 9). In this embodiment the gate nodes of transistors 612 and 630 are biased to an appropriate DC voltage in order to limit the maximum voltage at the drains of transistors 606 and 622 during both startup and AGC transients. Similarly, the gate nodes of transistors 614 and 632 are biased to an appropriate DC voltage in order to limit the minimum voltage at the drains of transistors 608 and 624 during both startup and AGC transients. The other features of active balun amplifier 600 are the same as those described with reference to FIG. 5 and are omitted here for conciseness.

Figure 7:
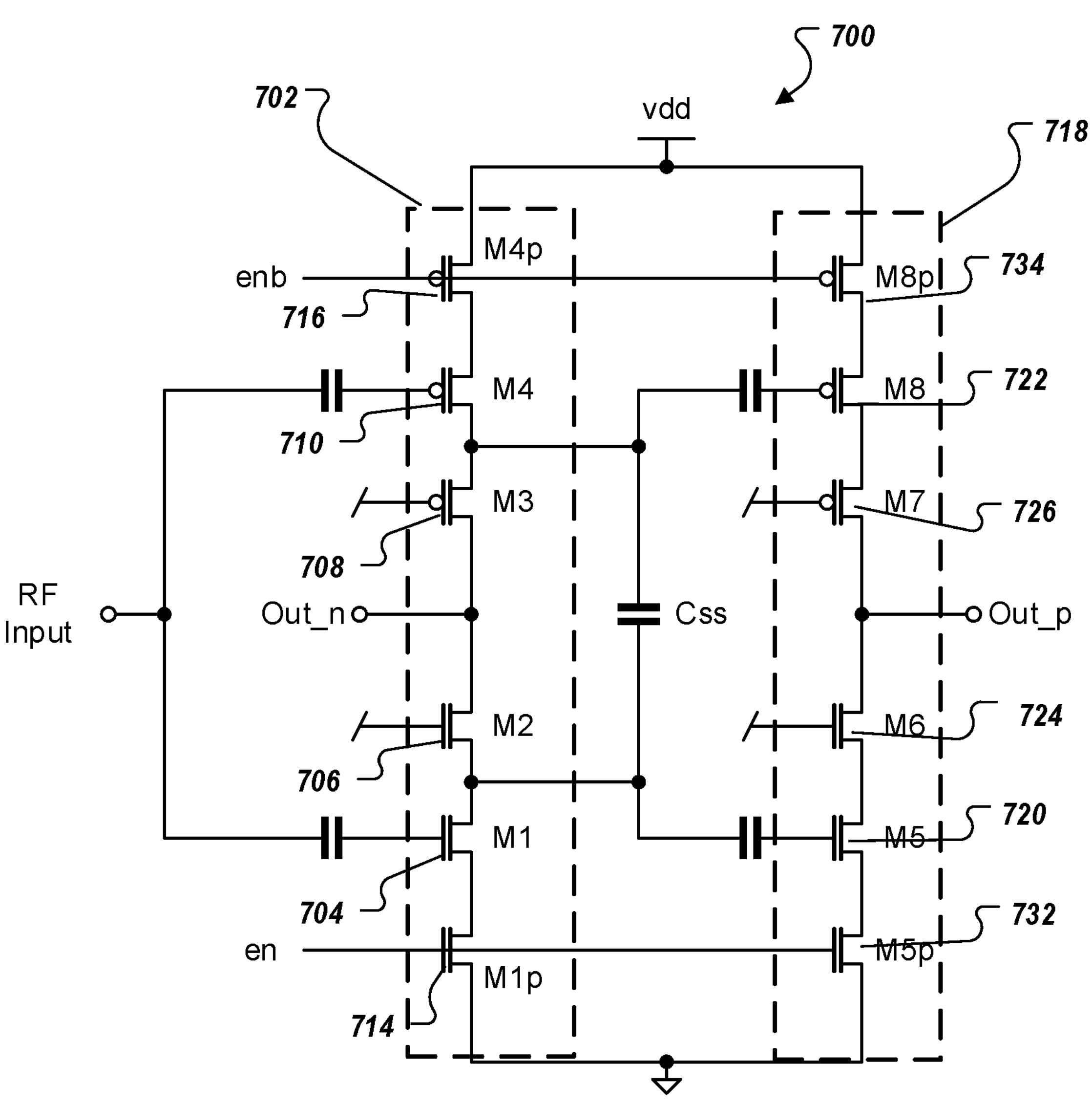
FIG. 7 is a schematic that illustrates another example of an active balun transconductance amplifier with over-voltage protection.

FIG. 7 is a schematic that illustrates an example of another alternative implementation of an active balun amplifier 700 with over-voltage protection. Active balun amplifier 700 has a first group of transistors 702 having a first plurality of metal oxide semiconductor (MOS) transistors arranged in series. The first group of transistors 702 includes transistors 704, 706, 708, and 710, which are the same as described above with reference to FIG. 5. The first group of transistors 702 further includes a first overvoltage protection transistor 714 coupled to the first input transistor 704 and a second overvoltage protection transistor 716 coupled to the second input transistor 710. In an implementation, transistor 714 can be of the first conductivity type and transistor 716 can be of the second conductivity type. For example, transistor 714 can be an NMOS transistor and transistor 716 can be a PMOS transistor.

Active balun amplifier 700 further has a second group of transistors 718 having a second plurality of MOS transistors arranged in series. The second group of transistors 718 includes a first common-source transistor 720 of the first conductivity type, a second common-source transistor 722 of the second conductivity type, and at least two cascode transistors 724 and 726 arranged in series between the first common source transistor 720 and the second common source transistor 722.

In addition to the four transistors described above with reference to FIG. 5, the second group of transistors 718 of amplifier 700 of FIG. 7 includes a third overvoltage protection transistor 732 coupled to the first common-source transistor 720, and a fourth overvoltage protection transistor 734 coupled to the second common-source transistor 722. A gate of the first overvoltage protection transistor 714 can be tied to a gate of the third overvoltage protection transistor 732, and a gate of the second overvoltage protection transistor 716 is tied to a gate of the fourth overvoltage protection transistor 734.

In an implementation, transistor 732 can be of the first conductivity type and transistor 734 can be of the second conductivity type. For example, transistor 732 can be an NMOS transistor and transistor 734 can be a PMOS transistor. In this embodiment, transistors 714, 716, 732, and 734 are added to provide overvoltage protection during both startup and automated gain control (AGC) transients through the appropriate biasing of the gates of these transistors (e.g. enabling or disabling these transistors). The other features of active balun amplifier 700 are the same as those described with reference to FIG. 5 and are omitted here for conciseness.

Figure 8:
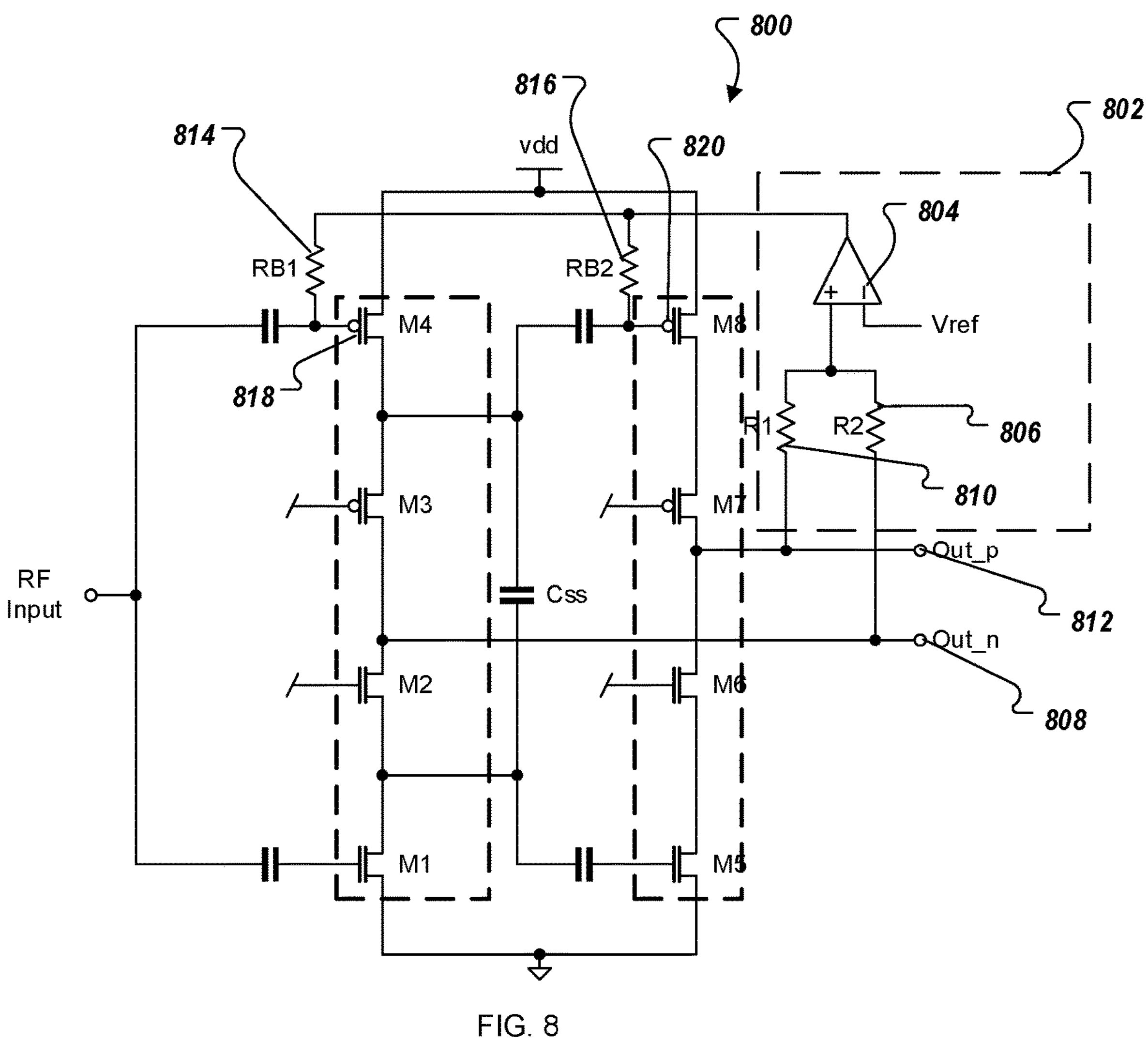
FIG. 8 is a schematic that illustrates an example of an active balun amplifier with common-mode feedback.

FIG. 8 is a schematic illustrating an example of a fully complementary common gate/common source (CG/CS) active balun amplifier 800 further including common mode control circuitry 802. The main amplifier circuit shown in FIG. 5 has very large output impedance due to the fully cascoded structure. Feedback is provided to control the output DC bias. In an implementation, active common mode feedback can be used. Active common mode feedback allows well-controlled output DC biasing over various process nodes and temperatures. It also allows for a segmented AGC architecture which provides reduced power dissipation at backed-off gain settings (described in more detail with reference to FIG. 9).

The active balun amplifier 800 has the same cascoded amplifier circuit structure as set out with reference to FIG. 5. The active balun amplifier 800 further includes common mode control circuitry 802 to provide feedback to control the DC bias. Common mode control circuitry 802 includes an operational amplifier 804, a first input of the operational amplifier 804 is coupled to a reference voltage. Common mode control circuitry 802 further includes a first sense resistor 806. A first end of the first sense resistor 806 is coupled to a second input of the operational amplifier 804, and a second end of the first sense resistor 806 is coupled to an output 808 of the first plurality of MOS transistors. Common mode control circuitry 802 further includes a second sense resistor 810, wherein a first end of the second sense resistor 810 is coupled to the second input of the operational amplifier 804, and a second end of the second sense resistor 810 is coupled to an output 812 of the second plurality of MOS transistors. A first bias resistor 814 and a second bias resistor 816 are further provided in the circuit 800. An output of the operational amplifier 804 is coupled to the gate of a second input transistor 818 through the first bias resistor 814 and to the gate of a second common-source transistor 820 through the second bias resistor 816.

Sense resistors 806, 810 are used to sense the output common mode DC bias. The sensed voltage is compared to the reference voltage and amplified to provide the gate bias for transistor 818 and transistor 820. The feedback loop drives the common mode output voltage to Vref.

Figure 9:
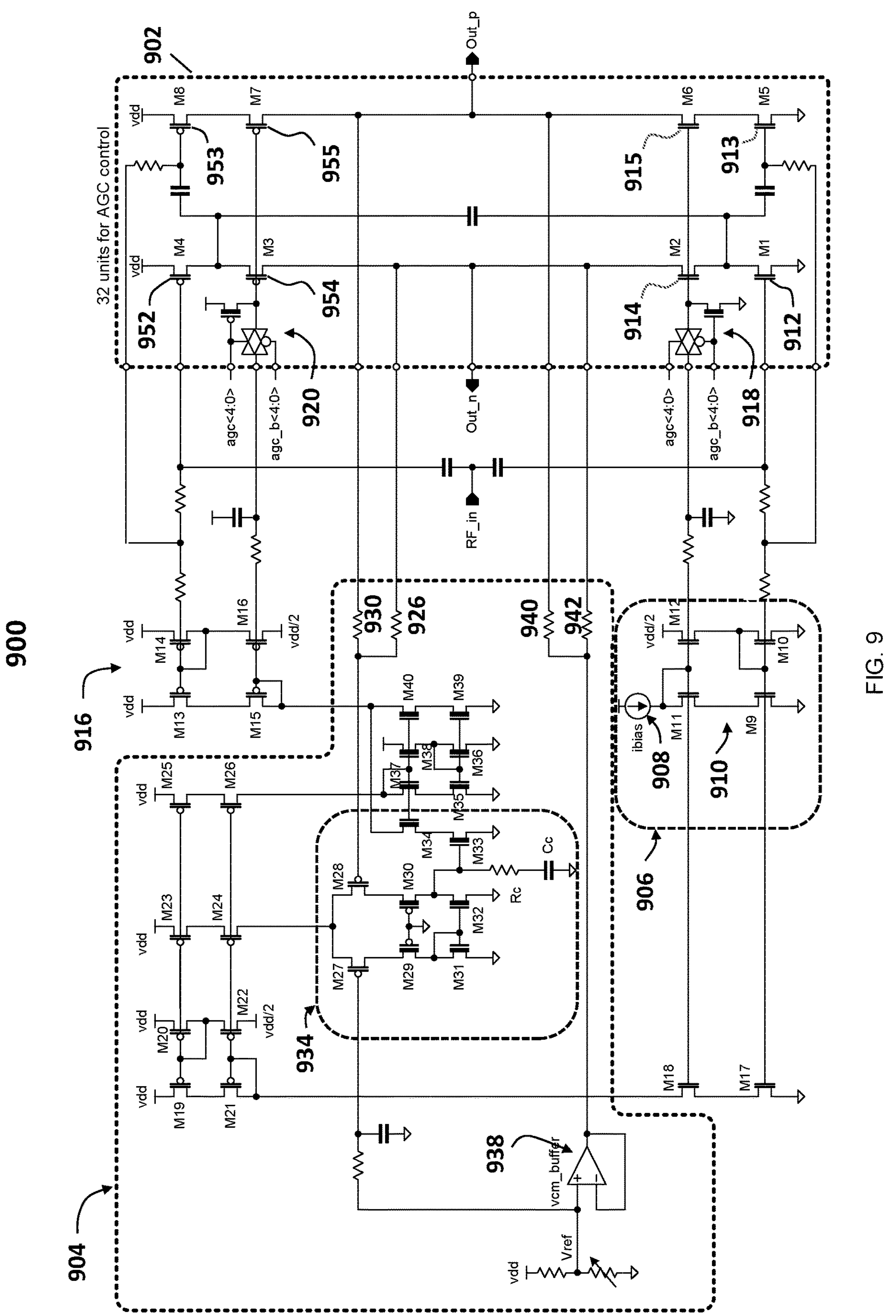
FIG. 9 is a schematic that illustrates an example of an active balun amplifier with DC biasing and automatic gain control.

FIG. 9 is a schematic that illustrates an example of a low noise amplifier 900 with DC biasing and automatic gain control. The active balun amplifiers as described herein can be implemented in the form of a low-noise amplifier with segmented AGC circuitry, which allows for reduced power dissipation at backed-off gain.

Low noise amplifier 900 includes a plurality of active balun amplifiers 902 connected in parallel. In the example implementation shown in FIG. 9, the low noise amplifier 900 includes 32 active balun amplifiers 902. However, other numbers of active balun amplifiers can be used such as, e.g., 4, 8, 16, or 64 active balun amplifiers.

Each active balun amplifier of the plurality of active balun amplifiers 902 is a fully complementary common gate/common source (CG/CS) active balun amplifier. For example, an active balun amplifier as described above with reference to FIGS. 5-8. In some implementations, the plurality of active balun amplifiers 902 can be bundled into binary-weighted groups e.g. six binary weighted groups (1×, 1×, 2×, 4×, 8×, and 16×). Each group of active balun amplifiers 902 can be independently enabled/disabled. Maximum gain is achieved when all groups are enabled. Minimum gain is achieved when only a single ix group is enabled. Intermediate levels of gain are achieved by enabling some groups while disabling other groups. This example enables an automated gain control (AGC) adjustment range from 0 dB to −30 dB. Power dissipation of the amplifier is proportional to the AGC setting. Accordingly, lower power dissipation at reduced gain setting can be achieved.

Each active balun amplifier 902 further is coupled to common mode control circuitry 904 (e.g., as described above with reference to FIG. 8). Low noise amplifier 900 can further include a current reference circuit 906, used to set the bias current of the active balun amplifier 902, coupled to a first active balun amplifier of the plurality of active balun amplifiers 902, wherein the current reference 906 circuit includes a bias current source 908 and a first current mirror 910, wherein the bias current source 908 is coupled to an input of the first current mirror 910. A first output of the first current mirror 910 is coupled to both a gate of the input transistor 912 and a gate of the common-source transistor 913 of the first active balun amplifier, and a second output of the first current mirror 910 is coupled to both a gate of the transistor 914 and a gate of the transistor 915 of the first active balun amplifier.

In an implementation, each of the plurality of active balun amplifiers 902 can further include a first transmission switching circuit 918, wherein the first transmission switching circuit 918 is coupled to a second output of the first current mirror 910 and to the gate of transistor 914 of the first active balun amplifier 902. In an implementation the plurality of active balun amplifiers 902 are connected in parallel, each of the plurality of active balun amplifiers 902 being separately enabled and disabled using a separate transmission switching circuit.

In an implementation, low noise amplifier 900 may further include a second current mirror 916, wherein a first output of the second current mirror 916 is coupled to both a gate of the input transistor 952 and a gate of the common-source transistor 953 of the active balun amplifier of the plurality of active balun amplifiers 902. A second transmission switching circuit 920 can be coupled to a second output of the second current mirror 916 and to both a gate of transistor 954 and a gate of transistor 955 of the active balun amplifier of the plurality of active balun amplifiers 902. An input to second current mirror 916 is coupled to an output of common mode control circuitry 904. This output from common mode control circuitry 904 provides a feedback reference current to second current mirror 916 in order to control an output common mode voltage of the plurality of active balun amplifiers 902.

Common mode control circuitry 904 includes a first sense resistor 926, a second sense resistor 930, and an operational amplifier 934. Sense resistors 926 and 930 are coupled between the active balun amplifier outputs and the operational amplifier 934 (e.g., as described above with reference to FIG. 8) and provides an output common mode voltage to a first input of operational amplifier 934. Reference voltage Vref is coupled to a second input of operational amplifier 934.

Common mode control circuitry 904 also includes a unity gain buffer 938. Reference voltage Vref is coupled to an input of unity gain buffer 938. An output of unity gain buffer 938 is coupled to a first end of load resistor 940. A second end of load resistor 940 is coupled to a first output of active balun amplifier 902. The output of unity gain buffer 938 is also coupled to a first end of load resistor 942. A second end of load resistor 942 is coupled to a second output of active balun amplifier 902. Load resistors 940 and 942 provide a controlled output impedance at the outputs of the active balun amplifier, enabling a stable common mode loop response associated with common mode control circuitry

904. Unity gain buffer 938 provides a low impedance reference voltage connection for load resistors 940 and 942, which can help maintain a desired common mode voltage at the outputs of active balun amplifier 902 when a majority of the plurality of active balun amplifiers 902 are disabled.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially be claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. An active balun amplifier, comprising:

a first plurality of metal oxide semiconductor (MOS) transistors arranged in series, the first plurality of MOS transistors comprising a first input transistor of a first conductivity type, a second input transistor of a second conductivity type, and at least two common-gate transistors arranged in series between the first input transistor and the second input transistor, wherein a gate of the first input transistor and a gate of the second input transistor are tied to a common input;

a second plurality of MOS transistors arranged in series, the second plurality of MOS transistors comprising a first common-source transistor of the first conductivity type, a second common-source transistor of the second conductivity type, and at least two cascode transistors arranged in series between the first common-source transistor and the second common-source transistor; and a coupling capacitor, wherein a first end of the coupling capacitor is coupled to a first coupling point located between the first input transistor and a first common-gate transistor and to a gate of the first common-source transistor, and wherein a second end of the coupling capacitor is coupled to a second coupling point located between the second input transistor and a second common-gate transistor and to a gate of the second common-source transistor.

2. The active balun amplifier of claim 1, wherein the first input transistor and the first common-source transistor are tied to ground.

3. The active balun amplifier of claim 1, wherein the second input transistor and the second common-source transistor are tied to a bias voltage supply.

4. The active balun amplifier of claim 1, wherein the first common-gate transistor is of the first conductivity type and is directly coupled to the first input transistor, and wherein the second common-gate transistor is of the second conductivity type and is directly coupled to the second input transistor.

5. The active balun amplifier of claim 1, wherein a first cascode transistor is of the first conductivity type and is directly coupled to the first common-source transistor, and wherein a second cascode transistor is of the second conductivity type and is directly coupled to the second common-source transistor.

6. The active balun amplifier of claim 5, wherein a gate of the first cascode transistor is coupled to an alternating current (AC) ground, and a gate of the second cascode transistor is coupled to the AC ground.

7. The active balun amplifier of claim 1, further comprising:

a first capacitor between the first end of the coupling capacitor and the gate of the first common-source transistor; and a second capacitor between the second end of the coupling capacitor and the gate of the second common-source transistor.

8. The active balun amplifier of claim 7, further comprising:

a third capacitor between the gate of the first input transistor and the common input; and a fourth capacitor between the gate of the second input transistor and the common input.

9. The active balun amplifier of claim 8, further comprising:

an operational amplifier, wherein a first input of the operational amplifier is coupled to a reference voltage;

a first sense resistor, wherein a first end of the first sense resistor is coupled to a second input of the operational amplifier, and wherein a second end of the first sense resistor is coupled to an output of the first plurality of MOS transistors;

a second sense resistor, wherein a first end of the second sense resistor is coupled to the second input of the operational amplifier, and wherein a second end of the second sense resistor is coupled to an output of the second plurality of MOS transistors, and wherein a first bias resistor; and a second bias resistor, wherein an output of the operational amplifier is coupled to the gate of the second input transistor through the first bias resistor and to the gate of the second common-source transistor through the second bias resistor.

10. The active balun amplifier of claim 9, wherein the output of the first plurality of MOS transistors is located between the first common-gate transistor and the second common-gate transistor, and wherein the output of the second plurality of MOS transistors is located between a first cascode transistor and a second cascode transistor.

11. The active balun amplifier of claim 1, wherein the first plurality of MOS transistors comprises four common-gate transistors arranged in series between the first input transistor and the second input transistor, and wherein the second plurality of MOS transistors comprises four cascode transistors between the first common-source transistor and the second common-source transistor.

12. The active balun amplifier of claim 1, wherein the first plurality of MOS transistors comprises:

a first overvoltage protection transistor coupled to the first input transistor, and a second overvoltage protection transistor coupled to the second input transistor, wherein the second plurality of MOS transistors comprises:

a third overvoltage protection transistor coupled to the first common-source transistor, and a fourth overvoltage protection transistor coupled to the second common-source transistor, and wherein a gate of the first overvoltage protection transistor is tied to a gate of the third overvoltage protection transistor, and a gate of the second overvoltage protection transistor is tied to a gate of the fourth overvoltage protection transistor.

13. A low noise amplifier circuit for automatic gain control, the low noise amplifier circuit comprising:

a plurality of active balun amplifiers, wherein each active balun amplifier of the plurality of active balun amplifiers comprises:

a first plurality of metal oxide semiconductor (MOS) transistors arranged in series, the first plurality of MOS transistors comprising a first input transistor of a first conductivity type, a second input transistor of a second conductivity type, and at least two common-gate transistors arranged in series between the first input transistor and the second input transistor;

a second plurality of MOS transistors arranged in series, the second plurality of MOS transistors comprising:

a first common-source transistor of the first conductivity type, a second common-source transistor of the second conductivity type, and at least two cascode transistors arranged in series between the first common-source transistor and the second common-source transistor; and a coupling capacitor, wherein a first end of the coupling capacitor is coupled to a first coupling point located between the first input transistor and a first common-gate transistor and to a gate of the first common-source transistor, and wherein a second end of the coupling capacitor is coupled to a second coupling point located between the second input transistor and a second common-gate transistor and to a gate of the second common-source transistor.

14. The low noise amplifier circuit of claim 13, further comprising:

a current reference circuit coupled to a first active balun amplifier of the plurality of active balun amplifiers, wherein the current reference circuit comprises:

a bias current source;

a first current mirror, wherein the bias current source is coupled to an input of the first current mirror, wherein an output of the first current mirror is coupled to a gate of the first input transistor of the first active balun amplifier, and wherein the output of the first current mirror is coupled to a gate of the first common-source transistor of the first active balun amplifier.

15. The low noise amplifier circuit of claim 14, further comprising:

a first transmission switching circuit, wherein the first transmission switching circuit is coupled to a second output of the first current mirror and to the first active balun amplifier.

16. The low noise amplifier circuit of claim 15, wherein the first transmission switching circuit comprises:

a transmission gate, wherein an input of the transmission gate is coupled to the second output of the first current mirror and wherein an output of the transmission gate is coupled to a gate of the first common-gate transistor of the first active balun amplifier and to a gate of a first cascode transistor of the first active balun amplifier; and a transmission MOS transistor of the first conductivity type, wherein a gate of the transmission MOS transistor is coupled to an active-low node of the transmission gate.

17. The low noise amplifier circuit of claim 15, further comprising:

a second current mirror, wherein a first output of the second current mirror is coupled to the first active balun amplifier of the plurality of active balun amplifiers.

18. The low noise amplifier circuit of claim 17, further comprising:

a second transmission switching circuit, wherein the second transmission switching circuit is coupled to a second output of the second current mirror and to the first active balun amplifier of the plurality of active balun amplifiers.

19. The low noise amplifier circuit of claim 15, further comprising:

an operational amplifier, wherein a first input of the operational amplifier is coupled to a reference voltage;

a first load resistor, wherein a first end of the first load resistor is coupled to a second input of the operational amplifier, and wherein a second end of the first load resistor is coupled to a first output of the first active balun amplifier of the plurality of active balun amplifiers;

a second load resistor, wherein a first end of the second load resistor is coupled to the second input of the operational amplifier, and wherein a second end of the second load resistor is coupled to a second output of the first active balun amplifier of the plurality of active balun amplifiers, and wherein an output of the operational amplifier is coupled to the second input of the operational amplifier.

20. The low noise amplifier circuit of claim 13, wherein a gate of the first input transistor and a gate of the second input transistor are coupled to a same radiofrequency input.

21. A transceiver, comprising:

a low noise amplifier circuit for automatic gain control, wherein the low noise amplifier circuit comprises:

a plurality of active balun amplifiers, wherein each active balun amplifier of the plurality of active balun amplifiers comprises:

a first plurality of metal oxide semiconductor (MOS) transistors arranged in series, the first plurality of MOS transistors comprising a first input transistor of a first conductivity type, a second input transistor of a second conductivity type, and at least two common-gate transistors arranged in series between the first input transistor and the second input transistor;

a second plurality of MOS transistors arranged in series, the second plurality of MOS transistors comprising a first common-source transistor of the first conductivity type, a second common-source transistor of the second conductivity type, and at least two cascode transistors arranged in series between the first common-source transistor and the second common-source transistor; and a coupling capacitor, wherein a first end of the coupling capacitor is coupled to a first coupling point located between the first input transistor and a first common-gate transistor and to a gate of the first common-source transistor, and wherein a second end of the coupling capacitor is coupled to a second coupling point located between the second input transistor and a second common-gate transistor and to a gate of the second common-source transistor.

22. The transceiver of claim 21, further comprising:

a current reference circuit coupled to a first active balun amplifier of the plurality of active balun amplifiers, wherein the current reference circuit comprises:

a bias current source;

a first current mirror, wherein the bias current source is coupled to an input of the first current mirror, wherein an output of the first current mirror is coupled to a gate of the first input transistor of the first active balun amplifier, and wherein the output of the first current mirror is coupled to a gate of the first common-source transistor of the first active balun amplifier.

23. The transceiver of claim 22, further comprising:

a first transmission switching circuit, wherein the first transmission switching circuit is coupled to a second output of the first current mirror and to the first active balun amplifier.

24. The transceiver of claim 23, wherein the first transmission switching circuit comprises:

a transmission gate, wherein an input of the transmission gate is coupled to the second output of the first current mirror and wherein an output of the transmission gate is coupled to a gate of the first common-gate transistor of the first active balun amplifier and to a gate of a first cascode transistor of the first active balun amplifier; and a transmission MOS transistor of the first conductivity type, wherein a gate of the transmission MOS transistor is coupled to an active-low node of the transmission gate.

25. The transceiver of claim 23, further comprising:

a second current mirror, wherein a first output of the second current mirror is coupled to the first active balun amplifier of the plurality of active balun amplifiers.

26. The transceiver of claim 25, further comprising:

a second transmission switching circuit, wherein the second transmission switching circuit is coupled to a second output of the second current mirror and to the first active balun amplifier of the plurality of active balun amplifiers.

27. The transceiver of claim 23, further comprising:

an operational amplifier, wherein a first input of the operational amplifier is coupled to a reference voltage;

a first load resistor, wherein a first end of the first load resistor is coupled to a second input of the operational amplifier, and wherein a second end of the first load resistor is coupled to a first output of the first active balun amplifier of the plurality of active balun amplifiers;

a second load resistor, wherein a first end of the second load resistor is coupled to the second input of the operational amplifier, and wherein a second end of the second load resistor is coupled to a second output of the first active balun amplifier of the plurality of active balun amplifiers, and wherein the output of the operational amplifier is coupled to the second input of the operational amplifier.

28. The transceiver of claim 21, wherein a gate of the first input transistor and a gate of the second input transistor are coupled to a same radiofrequency input.

* * * * *